United States Patent [19]

Engel

[11] Patent Number: 4,460,915
[45] Date of Patent: Jul. 17, 1984

[54] PLASTIC PACKAGE FOR RADIATION SENSITIVE SEMICONDUCTOR DEVICES

[75] Inventor: Paul R. Engel, Aloha, Oreg.

[73] Assignee: Intel Corporation, Santa Clara, Calif.

[21] Appl. No.: 334,478

[22] Filed: Dec. 28, 1981

[51] Int. Cl.³ .................... H01L 27/14; H01L 23/02; H01L 39/02; H01L 23/12
[52] U.S. Cl. ........................................ 357/74; 357/30; 357/80; 174/52 FP
[58] Field of Search ................ 357/72, 30, 74, 80; 365/94, 103, 106, 114, 215, 244; 174/52 FP

[56] References Cited

U.S. PATENT DOCUMENTS

| | | | |
|---|---|---|---|
| 3,622,419 | 11/1971 | London et al. | 357/74 |
| 3,924,246 | 12/1975 | Scherer | 357/74 |
| 4,186,996 | 2/1980 | Bowen et al. | 357/74 |
| 4,326,214 | 4/1982 | Trueblood | 357/74 |

FOREIGN PATENT DOCUMENTS

| | | | |
|---|---|---|---|
| 55-41748 | 3/1980 | Japan | 357/72 |
| 56-164559 | 12/1981 | Japan | 357/72 |

Primary Examiner—Andrew J. James
Assistant Examiner—John LaMont
Attorney, Agent, or Firm—Blakely, Sokoloff, Taylor & Zafman

[57] ABSTRACT

A plastic package for radiation sensitive electrically programmable read-only memory devices is disclosed. A "slug" of ultraviolet transmissive material, such as fused quartz, sapphire, or other suitable material is bonded to the radiation sensitive surface of the semiconductor chip. The chip is wire bonded and die attached in the conventional manner, and is then encapsulated within a shell using existing epoxy techniques. The slug is shaped such that its upper surface is not covered during the encapsulating process, and thus ultraviolet radiation can penetrate through the slug and be diffused onto the chip thereby erasing the memory cells.

4 Claims, 4 Drawing Figures

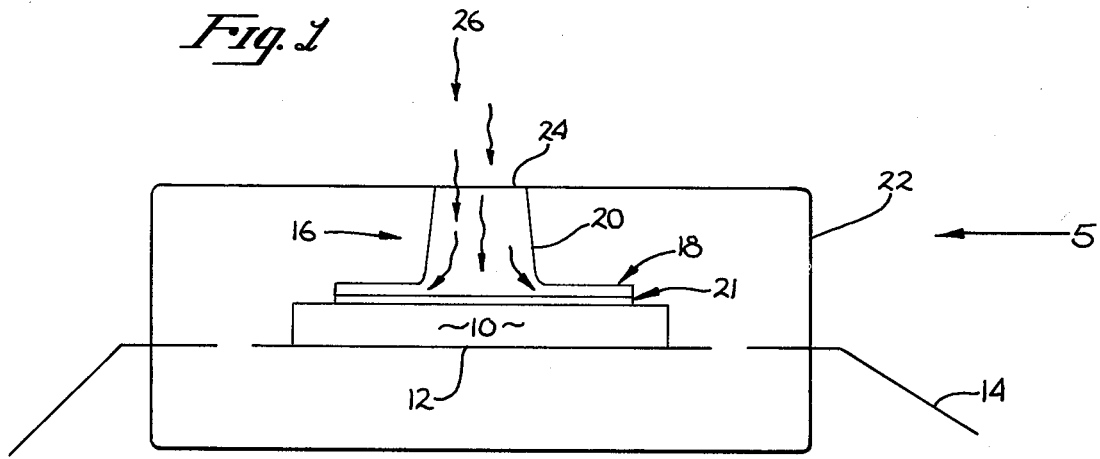
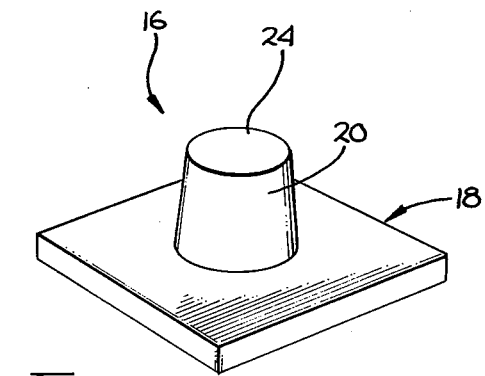
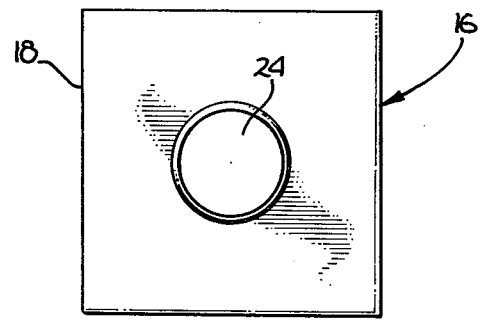
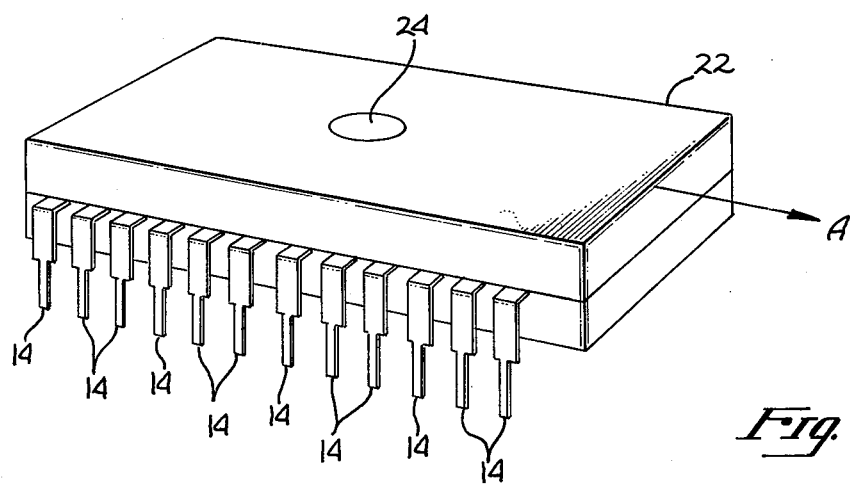

PLASTIC PACKAGE FOR RADIATION SENSITIVE SEMICONDUCTOR DEVICES

BACKGROUND OF THE INVENTION

The present invention relates to the field of plastic encapsulation of semiconductor devices, and more particularly to the encapsulation of electrically programmable read-only memory "chips" using plastic leaded chip carriers.

Historically, integrated circuits, fabricated for example with MOS technology, have been packed in a ceramic shell. Although effective, this method of encapsulation is costly and the manufacturing costs of the shell can amount to as much as or more than the cost of the integrated circuit itself. Recently, plastic encapsulation techniques have been developed which substantially lower the cost of packaging a semiconductor device. (See generally, Lineback, "TI Tries Out Plastic Leaded Chip-carriers," *Electronics*, June 30, 1981, page 39, and "Plastic Chip Carriers Show They Can Take It.," *Electronics*, July 28, 1981, page 44).

In one plastic packaging technique used by Amp, Inc. of Harrisburg, Pa., a plastic package is pre-molded on to the lead frame. The integrated circuit chip is then wired, bonded and potted with a silicone gel compound to protect against humidity. Another technique, being used by Texas Instruments, Inc., encapsulates the circuit in a thermo setting epoxy after the chip has been bonded.

However, conventional plastic packaging cannot be used for electrically programmable read-only memories, commonly known as EPROMS, since ultraviolet (UV) or other radiation must reach the surface of the packaged chip and pass through the chip's passivation layers in order to erase the memory cells. Thus, manufacturers of EPROMS have not been able to take advantage of new plastic encapsulation technology to lower unit costs.

Accordingly, there exists a need for a plastic package which is compatible with ultraviolet erasable, electrically programmable memory circuits, and which will allow UV radiation to reach the surface of the chip itself.

A primary object of the invention is, therefore, to provide a means by which ultraviolet radiation can reach a plastic encapsulated EPROM. A secondary object is to provide a means which will allow the use of plastic packaging of EPROMS, and thereby lower the cost of production. A further object is to provide a means to package an EPROM using currently available molding compounds as well as recently developed plastic packaging technology, without requiring the entire encapsulating shell to be UV transparent or the development of new compounds.

SUMMARY OF THE INVENTION

In accordance with the present invention, the foregoing objects are fulfilled by attaching a "slug" of UV transmissive material over the radiation sensitive surface of the semiconductor device, thereby creating a passage for the desired radiation to pass through to the chip. The device is wire bonded and die attached in the usual manner, and the assembly is then molded using existing plastic encapsulation techniques.

The slug can be shaped in accordance with the dimensions of the chip, and is sized such that the upper surface of the slug is approximately flush with the exterior surface of the plastic package. In order to prevent dislodgement during encapsulation, the slug is bonded to the semiconductor device by a thin film of UV transmissive adhesive.

The presence of the slug, provides a UV transmissive channel through the otherwise opaque plastic package to allow the desired radiation to reach the surface of the semiconductor device, and erase the memory cells.

The foregoing and other objects, features and advantages of the present invention will be more readily apparent from the following detailed description, which proceeds with reference to the accompanying drawings.

BRIEF DESCRIPTION OF THE DRAWINGS

FIG. 1 is a cross sectional end view of a semiconductor package employing the present invention.

FIG. 2 is a perspective view of the transmissive slug as described in the presently preferred embodiment.

FIG. 3 is a plan view of the slug shown in FIG. 2.

FIG. 4 is a top view of a plastic encapsulated semiconductor device built in accordance with the present invention.

DETAILED DESCRIPTION OF THE PREFERRED EMBODIMENT

A package for an integrated circuit which allows desired incident radiation to pass through the package and be diffused over the surface of the encapsulated circuit is disclosed. In the following description for the purposes of explanation, specific numbers, materials, and radiation types, are set forth and mentioned to provide a thorough understanding of the present invention. However, it will be apparent to one skilled in the art that the present invention may be practiced without these specific details. In other instances, well known semiconductor manufacturing and packaging processes and techniques are referred to but not discussed in detail in order not to obscure the present invention unnecessarily.

Referring to the drawings, in FIG. 1 the present invention, designated generally at 5, includes an ultraviolet erasable, electrically programmable read-only memory device (EPROM) 10 which has been wire bonded and die attached to the die attached pad 12 and lead frame 14, in the usual manner as is typical in the art. Although the present invention is particularly suited to EPROMS, it will be appreciated that the invention can be used by any semiconductor device which requires that some form of electromagnetic radiation reach the surface of the device.

Referring to FIGS. 1 and 2, a "slug," designated generally as 16 is constructed of a ultraviolet transmissive material, such as but not limited to, fused silica, quartz, sapphire, Corning UV transmissive glass or other suitable material which can withstand the desired encapsulation process. In the presently preferred embodiment, the slug 16 is an integral unit including a generally rectilinear base 18 and a cylindrical guide 20. The base 18 and guide 20 portions are sized in accordance with the dimensions of the particular semiconductor device, with the base 18 being sized to cover the radiation sensitive areas of the EPROM 10. The base 18 is bonded to the upper surface of the EPROM 10 by a thin layer of ultraviolet transmissive adhesive 21, such as Dow Corning 1-2577.

After the slug 16 has been bonded to the EPROM 10, the entire assembly is encapsulated using existing epoxy molding compounds and techniques forming a package 22. It will be noted that the particular order of assembly prior to encapsulation is for the purpose of this application essentially immaterial, and that the above recitation is merely exemplary of one order of construction. For example, the present invention may also be used where the semiconductor is bonded in a premolded plastic package, the slug being attached just prior to the final encapsulation process.

The length of guide 20 is sized in accordance with the desired thickness of package 22, such that the upper surface 24 of the guide 20 is flush with or extends beyond the exterior surface of the package 22 (see FIG. 4), thereby forming a passage by which ultraviolet radiation can travel to the surface of the EPROM 10. During the encapsulation process, any excess epoxy ("flash") which has affixed itself on the upper surface 24 of the guide 20, can easily be removed by sanding, grinding, polishing or chemical deflashing, so as to provide an unobstructed surface for UV radiation to penetrate.

It will be appreciated that specific shape of the slug 16 can be varied to minimize manufacturing costs and modifications of existing molds, without sacrificing radiation transmissivity. For example, the slug can be cylindrical, rectangular or the like. However, the presently preferred embodiment as shown in FIG. 2 has the advantage of minimizing the amount of the UV transmissive material required while insuring that the desired radiation 26 reaches all sensitive areas of the EPROM 10. In addition, it will be noted that one or more surfaces of the slug 16 may be mirrored or otherwise polished to increase the internal reflectance of radiation passing therein, and guide the radiation 26 toward the surface of the EPROM 10.

In order to erase a previously programed EPROM 10, the package including the encapsulated chip is exposed to ultraviolet radiation 26. The radiation encounters the upper surface 24 of the guide 20, and is conducted through the guide and into the interior of the slug 16 being diffused within its base 18. Radiation sensitive surfaces adjacent to the base 18 are thereby exposed to the radiation 26, and erasure of the memory cells adjacent to the base is effectively accomplished.

It will be appreciated by one skilled in the art that the transmissive passage provided by slug 16 may be formed after EPROM 10 has been encapsulated. Once the EPROM has been wire bonded and die attached in the conventional manner as previously discussed, the epoxy package 22 is formed around the EPROM and molded to provide a passage extending from the outside environment to the radiation sensitive surfaces of the EPROM 10. Liquefied UV transmissive material, such as for example, gel or plastic, is injected into the passage where it solidifies sealing package 22 and forming the UV transmissive slug 16.

Thus, a plastic package for a semiconductor device requiring incident radiation has been disclosed. The package includes a transmission passage which guides incident radiation through the package and onto the surface of the semiconductor device.

I claim:

1. A plastic package for a programmable read-only memory device, comprising:
   a radiation transmissive member suitably transmissive to a desired wave-length of electromagnetic radiation, in contact with a radiation sensitive surface of said semiconductor device;
   said radiation transmissive member comprising:
   a guide portion including an exterior face;
   a base portion integrally coupled to said guide portion including a first surface in contact with said radiation sensitive surface;
   an opaque encapsulating plastic shell surrounding said device;
   said guide portion being sized so as to be visible on a surface of said shell, and to provide a radiation transmissive passage through said shell to said radiation sensitive surface;
   whereby radiation incident on said shell passes through said member and onto said radiation sensitive surface of said device.

2. The plastic package of claim 1 wherein said radiation transmissive member is transmissive to ultraviolet radiation.

3. The plastic package of claim 2, wherein said transmissive member is bonded to said semiconductor device by a film of ultraviolet transparent adhesive.

4. The plastic package of claim 3, wherein said radiation transmissive member is comprised of ultraviolet transmissive glass.

* * * * *